US012581642B2

(12) United States Patent
Park et al.

(10) Patent No.: US 12,581,642 B2
(45) Date of Patent: Mar. 17, 2026

(54) SEMICONDUCTOR DEVICE

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 371 days.

(21) Appl. No.: 18/300,180

(22) Filed: Apr. 13, 2023

(65) Prior Publication Data

US 2023/0337414 A1      Oct. 19, 2023

(30) Foreign Application Priority Data

Apr. 14, 2022    (KR) ........................ 10-2022-0046499

(51) Int. Cl.
H10B 12/00            (2023.01)
(52) U.S. Cl.
CPC ................................. H10B 12/315 (2023.02)
(58) Field of Classification Search
CPC ...... H10B 12/315; H10B 53/30; H10B 12/33;
H10B 12/31; H10B 12/30–395; H10B
12/03–0387; H10B 53/00–50; H10D
1/684; H10D 1/716; H10D 1/68; H10D
1/682–688; H01L 23/642
See application file for complete search history.

(56) References Cited

U.S. PATENT DOCUMENTS

| | | | | |
|---|---|---|---|---|
| 5,978,207 | A | * | 11/1999 | Anderson ............. C23C 14/088 |
| | | | | 361/312 |
| 6,043,529 | A | | 3/2000 | Hartner et al. |
| 7,842,946 | B2 | | 11/2010 | Lin et al. |
| 8,106,434 | B2 | | 1/2012 | Furukawa et al. |
| 9,269,785 | B2 | | 2/2016 | Mueller et al. |
| 9,978,753 | B2 | * | 5/2018 | Ahn ..................... H10B 12/485 |
| 11,101,362 | B2 | | 8/2021 | Chen et al. |
| 11,688,557 | B2 | | 6/2023 | Higuchi et al. |

(Continued)

FOREIGN PATENT DOCUMENTS

| | | | |
|---|---|---|---|
| JP | 2017-059751 | A | 3/2017 |
| KR | 10-2021-0075727 | A | 6/2021 |

(Continued)

OTHER PUBLICATIONS

Decision to Refuse in corresponding TW Patent Application 112113529, dated Jul. 16, 2024, 4 pages.

(Continued)

*Primary Examiner* — Cuong B Nguyen
(74) *Attorney, Agent, or Firm* — Morgan, Lewis & Bockius LLP

(57) ABSTRACT

A semiconductor device includes a cell capacitor disposed on a substrate and that and includes a first electrode, a dielectric layer structure, and a second electrode. The dielectric layer structure includes a first dielectric layer disposed on the first electrode and that includes a ferroelectric material, a second dielectric layer disposed on the first dielectric layer and that includes an antiferroelectric material, and dielectric particles dispersed in at least one of the first dielectric layer or the second dielectric layer and that include a paraelectric material.

20 Claims, 14 Drawing Sheets

10

(56)                  References Cited

U.S. PATENT DOCUMENTS

| | | |
|---|---|---|
| 2007/0040204 A1 | 2/2007 | Pulugurtha et al. |
| 2010/0001324 A1 | 1/2010 | Furukawa et al. |
| 2011/0147891 A1 | 6/2011 | Furukawa et al. |
| 2015/0228408 A1 | 8/2015 | Koutsaroff et al. |
| 2016/0087111 A1 | 3/2016 | Toonen et al. |
| 2019/0148390 A1 | 5/2019 | Frank |
| 2021/0359082 A1 | 11/2021 | Kang |
| 2022/0077162 A1 | 3/2022 | Hong et al. |
| 2023/0363174 A1 | 11/2023 | Yamazaki et al. |

FOREIGN PATENT DOCUMENTS

| | | |
|---|---|---|
| TW | 200828570 A | 7/2008 |
| TW | 201533888 A | 9/2015 |
| TW | 202008590 B | 2/2020 |
| TW | 202114052 A | 4/2021 |
| TW | 202209649 A | 3/2022 |
| TW | 202211390 A | 3/2022 |
| TW | 202213766 A | 4/2022 |

OTHER PUBLICATIONS

Notice of Allowance dated Nov. 18, 2025 issued in corresponding to Korean Patent Application No. 10-2022-0046499.

* cited by examiner

B1 – B1'

B2 – B2'

SEMICONDUCTOR DEVICE

CROSS-REFERENCE TO RELATED APPLICATION

This application claims priority under 35 U.S.C. § 119 from Korean Patent Application No. 10-2022-0046499, filed on Apr. 14, 2022 in the Korean Intellectual Property Office, the contents of which are herein incorporated by reference in their entirety.

TECHNICAL FIELD

Embodiments of the inventive concept are directed to a semiconductor device, and more particularly, to a semiconductor device that includes a capacitor structure.

DISCUSSION OF THE RELATED ART

The size of a cell capacitor of a dynamic random access memory (DRAM) device is being reduced as semiconductor devices are being downscaled. However, even though the size of the cell capacitor is reduced, the capacitance required for a unit cell of the DRAM device has a constant value. Accordingly, various attempts have been proposed to increase the capacitance of the cell capacitor using a high dielectric constant metal oxide.

SUMMARY

Embodiments of the inventive concept provide a semiconductor device that includes a cell capacitor that has a high capacitance.

According to an embodiment of the inventive concept, there is provided a semiconductor device that includes a cell capacitor disposed on a substrate and that includes a first electrode, a dielectric layer structure, and a second electrode. The dielectric layer structure includes a first dielectric layer disposed on the first electrode and that includes a ferroelectric material, a second dielectric layer disposed on the first dielectric layer and that includes an antiferroelectric material, and dielectric particles dispersed in at least one of the first dielectric layer or the second dielectric layer and that include a paraelectric material.

According to an embodiment of the inventive concept, there is provided a semiconductor device that includes a cell capacitor disposed on a substrate and that includes a first electrode, a dielectric layer structure, and a second electrode. The dielectric layer structure includes a first dielectric layer that has a first thickness in a thickness direction of the dielectric layer structure and includes a ferroelectric material, a second dielectric layer disposed on the first dielectric layer and that has a second thickness in the thickness direction of the dielectric layer structure and includes an antiferroelectric material, and dielectric particles dispersed in the first dielectric layer and the second dielectric layer and that include a paraelectric material. The dielectric particles include a material that has a coefficient of thermal expansion greater than $5.0 \times 10^{-6}$/K, and the dielectric particles impart stress to first grains of the first dielectric layer and second grains of the second dielectric layer.

According to an embodiment of the inventive concept, there is provided a semiconductor device that includes a word line disposed in a word line trench that extends in a first direction on a substrate, a capacitor contact disposed on the substrate at one side of the word line, and a cell capacitor disposed on the capacitor contact and electrically connected to the capacitor contact. The cell capacitor includes a first electrode disposed on the capacitor contact, a dielectric layer structure disposed on the first electrode, and a second electrode disposed on the dielectric layer structure. The dielectric layer structure includes a first dielectric layer disposed on the first electrode and that includes a ferroelectric material, a second dielectric layer disposed on the first dielectric layer and that includes an antiferroelectric material, and dielectric particles dispersed in at least one of the first dielectric layer or the second dielectric layer, and that include a paraelectric material. The dielectric particles include at least one of $Y_2O_3$, $Al_2O_3$, $ZrO_2$, $SiO_2$, $TiO_2$, or $Cr_2O_3$.

DETAILED DESCRIPTION

Figure 1:
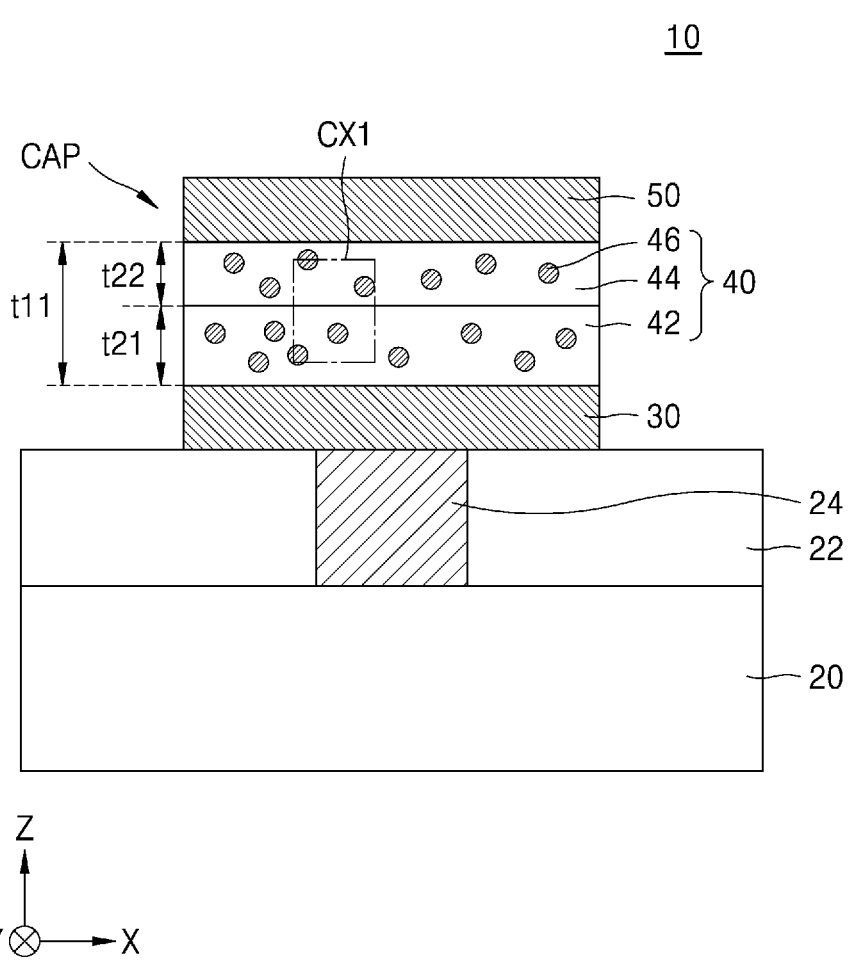
FIG. 1 is a cross-sectional view of a semiconductor device according to embodiments.
Figure 2:
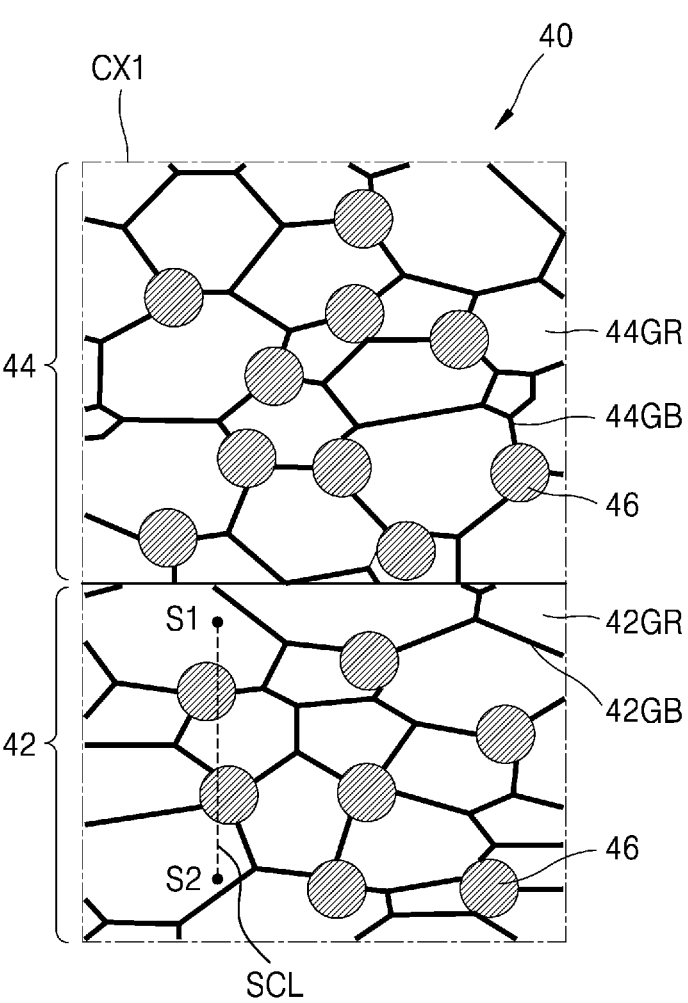
FIG. 2 is an enlarged view of a portion CX1 of FIG. 1.
Figure 3:
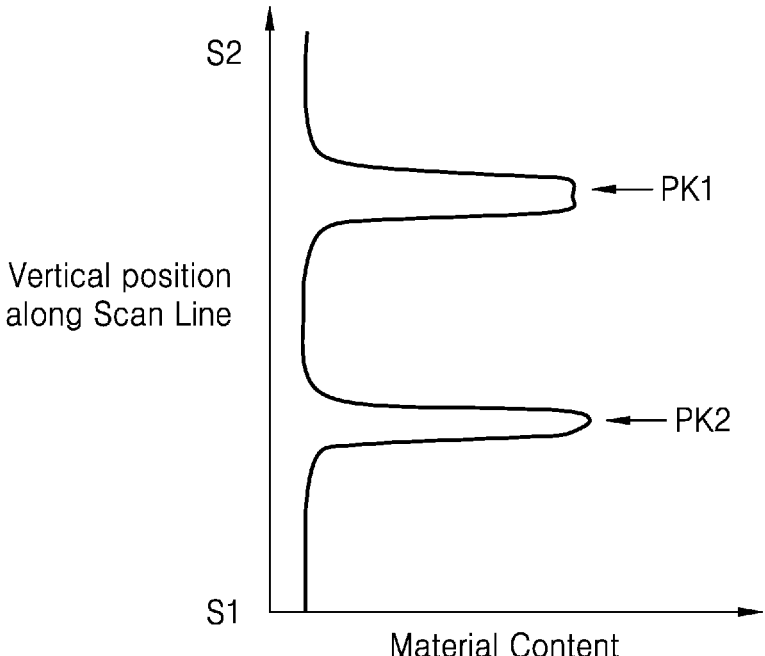
FIG. 3 is a graph of the content of a material constituting the dielectric particles as a function of a scan line position in FIG. 2.

FIG. 1 is a cross-sectional view of a semiconductor device 10 according to embodiments. FIG. 2 is an enlarged view of a portion CX1 of FIG. 1. FIG. 3 is a graph schematically showing the content of a material constituting dielectric particles 46 according to the scan line of FIG. 2.

Referring to FIGS. 1 to 3, in an embodiment, the semiconductor device 10 includes a lower insulating layer 22 disposed on a substrate 20, a contact 24 disposed on the substrate 20 and surrounded by the lower insulating layer 22, and a cell capacitor CAP disposed on the contact 24.

The substrate 20 includes a semiconductor material, such as silicon (Si), germanium (Ge), silicon germanium (SiGe), silicon carbide (SiC), gallium arsenide (GaAs), indium arsenide (InAs), or indium phosphide (InP). In embodiments, the substrate 20 includes a conductive region, such as an impurity-doped well or an impurity-doped structure. In addition, a switching component, such as a transistor, a diode, etc., that provides a signal to the cell capacitor CAP, is provided on the substrate 20. The lower insulating layer 22 covers the switching component, and the contact 24 is electrically connected to the switching component.

The cell capacitor CAP includes a first electrode 30, a dielectric layer structure 40, and a second electrode 50 that are sequentially stacked on the contact 24. For example, the dielectric layer structure 40 is provided between the first electrode 30 and the second electrode 50, and the first electrode 30 is in contact with the contact 24. However, in embodiments, the dielectric layer structure 40 is provided between the first electrode 30 and the second electrode 50, and the second electrode 50 is in contact with the contact 24.

In embodiments, each of the first electrode 30 and the second electrode 50 includes at least one of doped polysilicon, a metal such as ruthenium (Ru), titanium (Ti), tantalum (Ta), or tungsten (W), etc., or a metal nitride such as titanium nitride (TiN), tantalum nitride (TaN), tungsten nitride (WN), chromium nitride (CrN), vanadium nitride (VN), molybdenum nitride (MoN), niobium nitride (NbN), titanium silicon nitride (TiSiN), titanium aluminum nitride (TiAlN), or tantalum aluminum nitride (TaAlN). In some embodiments, each of the first electrode 30 and the second electrode 50 includes a single layer made of the aforementioned material, or a stacked structure of two or more layers.

The dielectric layer structure 40 includes a first dielectric layer 42, a second dielectric layer 44, and dielectric particles 46. The first dielectric layer 42 faces or contacts the first electrode 30. The second dielectric layer 44 is disposed on the first dielectric layer 42 and faces or contacts the second electrode 50. The dielectric particles 46 are dispersed and arranged in at least one of the first dielectric layer 42 or the second dielectric layer 44. The dielectric layer structure 40 has a thickness t11 of about 30 Å to 60 Å in a thickness direction of the dielectric layer structure 40, such as the Z direction of FIG. 1.

In embodiments, the first dielectric layer 42 includes a ferroelectric material, such as at least one of $HfO_2$, $Hf_{1-x}Zr_xO_2$ ($0<x\leq0.5$), $Ba_{1-x}Sr_xTiO_3$ ($0\leq x\leq0.3$), $BaTiO_3$, or $PbZr_xTi_{1-x}O_3$ ($0\leq x\leq0.1$). For example, the ferroelectric material further includes a dopant, and the dopant includes at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The first dielectric layer 42 has a first thickness t21 in the thickness direction, such as the Z direction of FIG. 1, of the dielectric layer structure 40, and the first thickness t21 ranges from about 10 Å to 40 Å.

In embodiments, the second dielectric layer 44 includes an antiferroelectric material, such as at least one of $Hf_{1-x}Zr_xO_2$ ($0.5<x<1.0$), $ZrO_2$, $PbZrO_3$, or $PbHfO_3$. For example, the antiferroelectric material further includes a dopant, and the dopant includes at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The second dielectric layer 44 has a second thickness t22 in the thickness direction (for example, in the Z direction of FIG. 1, of the dielectric layer structure 40, and the second thickness t22 ranges from about 10 Å to 40 Å.

The dielectric particles 46 are dispersed and arranged in at least one of the first dielectric layer 42 or the second dielectric layer 44. The dielectric particles 46 include a paraelectric material, such as at least one of $Y_2O_3$, $Al_2O_3$, $ZrO_2$, $SiO_2$, $TiO_2$, or $Cr_2O_3$. The dielectric particles 46 include a material whose thermal expansion coefficient is greater than $5.0\times10^{-6}$/K. The dielectric particles 46 have an average diameter in a range of about 1 Å to 5 Å.

In embodiments, the first dielectric layer 42 includes first grains 42GR, and a boundary between adjacent first grains 42GR may be referred to as a grain boundary 42GB. The second dielectric layer 44 includes second grains 44GR, and a boundary between adjacent second grains 44GR may be referred to as a grain boundary 44GB. As shown in FIG. 2, the dielectric particles 46 are dispersed in the grain boundary 42GB between the first grains 42GR of the first dielectric layer 42, and the dielectric particles 46 are also dispersed in the grain boundary 44B between the second grains 44GR of the second dielectric layer 44.

In embodiments, a content of the dielectric particles 46 in the first dielectric layer 42 is about 1% to about 10%, relative to the total weight of the first dielectric layer 42, and a content of the dielectric particles 46 in the second dielectric layer 44 is about 1% to about 10%, relative to the total weight of the second dielectric layer 44. In addition, a content of the dielectric particles 46 is about 1% to about 10% of the total weight of the dielectric layer structure 40.

As the dielectric particles 46 are dispersed and arranged at the grain boundaries 42GB and 44GB, the material content of the dielectric particles 46 has a discrete distribution that has peaks at certain positions, as shown in FIG. 3. The material content of the dielectric particles 46 can be measured by, for example, energy dispersive spectroscopy of a transmission electron microscope, energy dispersion spectroscopy of a scanning electron microscope, or the like. For example, when the dielectric particles 46 include an aluminum oxide, the content of aluminum can be measured as a function of a vertical position along a scan line SCL from a first scan point S1 to a second scan point S2. As illustrated in FIG. 3, the content of aluminum has peak values, such as a first peak PK1 and a second peak PK2, at the position where the dielectric particles 46 are present.

According to embodiments, the dielectric layer structure 40 is formed by sequentially forming, on the first electrode 20, the first dielectric layer 42 that includes the dielectric particles 46 dispersed therein, and forming on the first dielectric layer 42 the second dielectric layer 44 that includes the dielectric particles 46 dispersed therein. In addition, an annealing process is performed on the dielectric layer structure 40 at a temperature of about 200° C. to 700° C.

For example, since the dielectric particles 46 include a material that has a coefficient of thermal expansion greater than $5.0\times10^{-6}$/K, local stress, such as tensile stress, can be applied to the dielectric particles 46, compared to the first grains 42GR of the first dielectric layer 42 and the second grains 44GR of the second dielectric layer 44, which are arranged around the dielectric particles 46 after the annealing process, due to the relatively large thermal expansion properties of the dielectric particles 46. Local stress is applied to the first grain 42GR of the first dielectric layer 42 and the second grain 44GR of the second dielectric layer 44 to suppress remnant polarization properties, or remnant polarization properties of the antiferroelectric material, in the first dielectric layer 42 and the second dielectric layer 44. The dielectric layer structure 40 exhibit superparaelectric properties, thereby allowing the cell capacitor CAP to have a relatively high capacitance.

Figure 4:
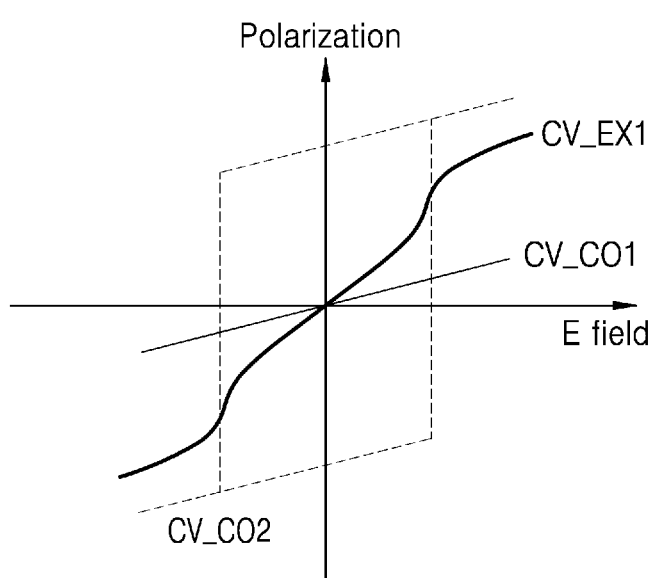
FIG. 4 is a graph of polarization properties of a dielectric layer structure according to embodiments.
Figure 5:
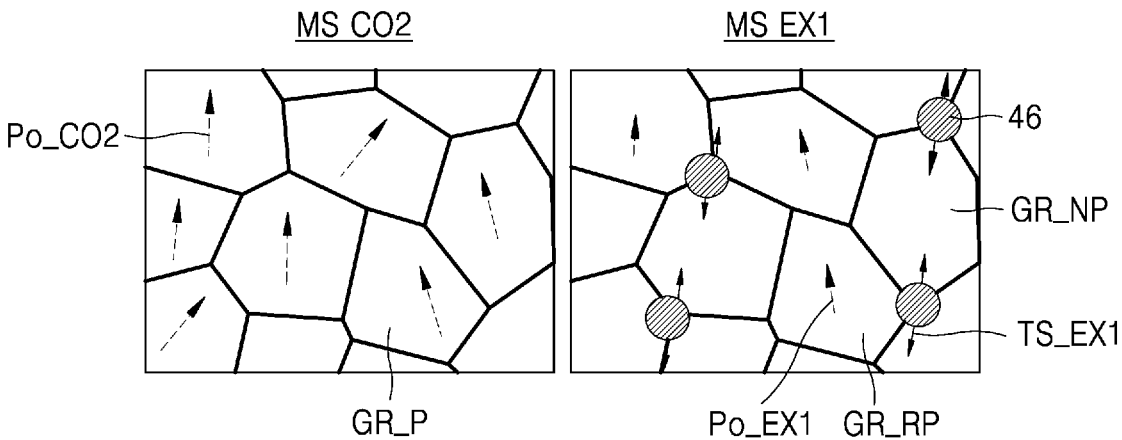
FIG. 5 illustrates polarization behavior of a dielectric layer structure according to embodiments.

FIG. 4 is a graph of polarization properties of a dielectric layer structure according to embodiments. FIG. 5 illustrates polarization behavior of a dielectric layer structure according to embodiments.

In FIG. 4, a polarization curve CV_EX1 of a dielectric layer structure according to embodiments is schematically illustrated together with a polarization curve CV_CO1 of a dielectric layer according to Comparative Example 1 and a polarization curve CV_CO2 of a dielectric layer according to Comparative Example 2. The dielectric layer according to Comparative Example 1 includes a paraelectric material, and the dielectric layer according to Comparative Example 2 includes a ferroelectric material. FIG. 5 schematically illustrates the microstructure MS_CO2 of the dielectric layer according to Comparative Example 2 and the microstructure MS_EX1 of the dielectric layer structure according to embodiments.

According to the polarization curve CV_CO1 of the dielectric layer according to Comparative Example 1 shown in FIG. 4, as the electric field increases in a positive range, polarization linearly increases, and when the electric field decreases, the polarization linearly decreases, and when the electric field becomes 0, the polarization becomes 0. As the electric field decreases in a negative range, for example, as the magnitude of the electric field increases, the polarization linearly decreases, when the electric field increases again, the polarization linearly increases, and when the electric field becomes 0, the polarization also becomes 0. The dielectric layer according to Comparative Example 1 has paraelectric properties and has a relatively low polarization value.

Referring to the polarization curve CV_CO2 of the dielectric layer according to Comparative Example 2 shown in FIG. 4, as the electric field increases in a positive range, polarization linearly increases, and when the electric field decreases, the polarization linearly decreases, but when the electric field becomes 0, the polarization has a value greater than 0. As the electric field decreases in a negative range, for example, as the magnitude of the electric field increases, the polarization decreases, and when the electric field increases again, the polarization increases, but when the electric field becomes 0, the polarization has a value less than 0. For example, the dielectric layer according to Comparative Example 2 has a predetermined polarization value of non-zero, that is, a remnant polarization, even when the external electric field is removed. The dielectric layer according to Comparative Example 2 has ferroelectric properties characterized by hysteresis or a remnant polarization in a polarization-field curve, and has a relatively high polarization value.

As shown in FIG. 5, in the microstructure MS_CO2 of the dielectric layer according to Comparative Example 2, after the electric field is removed, the grains have a remnant or residual polarization Po_CO2, and such grains are referred to as polarization grains GR_P. The hysteresis or remnant polarization in the polarization-field curve is generated by the polarization grain GR_P.

Referring to the polarization curve CV_EX1 of a dielectric layer structure according to the embodiments shown in FIG. 4, as the electric field increases in a positive range, polarization increases, when the electric field decreases, the polarization decreases, and when the electric field becomes 0, the polarization becomes 0. As the electric field decreases in a negative range, for example, as the magnitude of the electric field increases, the polarization decreases, when the electric field increases again, the polarization increases, and when the electric field becomes 0, the polarization also becomes 0. For example, a dielectric layer structure according to embodiments does not have a remnant polarization. A dielectric layer structure according to embodiments has superparaelectric properties, has a polarization value much greater than a polarization value of a conventional paraelectric material that exhibits general paraelectric characteristics, and exhibits a behavior similar to that of a paraelectric material in that there is no remnant polarization.

As illustrated in FIG. 5, a dielectric layer structure according to embodiments includes dielectric particles 46 dispersed at grain boundaries of a ferroelectric material or at grain boundaries of an antiferroelectric material, and include a paraelectric dielectric material and a material that has a thermal expansion coefficient of $5.0 \times 10^{-6}$/K. While the dielectric layer according to Comparative Example has a polarization grain GR_P after the electric field is removed, a dielectric layer structure according to embodiments includes a non-polarization grain GR_NP and a reduced polarization grain GR_RP that has a reduced polarization Po_EX1 due to relatively large thermal expansion of the dielectric particles 46.

For example, due to relatively large thermal expansion of the dielectric particles 46, tensile stress TS_EX1 can be applied to the dielectric particles 46. In addition, stress is applied to some of the grains that contact the dielectric particles 46 and polarization does not remain after the electric field is removed, and such grains are referred to as non-polarization grains GR_NP. In addition, stress is applied to some of the grains that contacting the dielectric particles 46 and a relatively small amount of polarization Po_EX1 remains after the electric field is removed, and such grains are referred to as reduced polarization grains GR_RP. As a result of local stress application by the dielectric particles 46, the dielectric layer structure has no remnant polarization and has superparaelectric characteristics that have a relatively large polarization or a relatively high capacitance.

Figure 6:
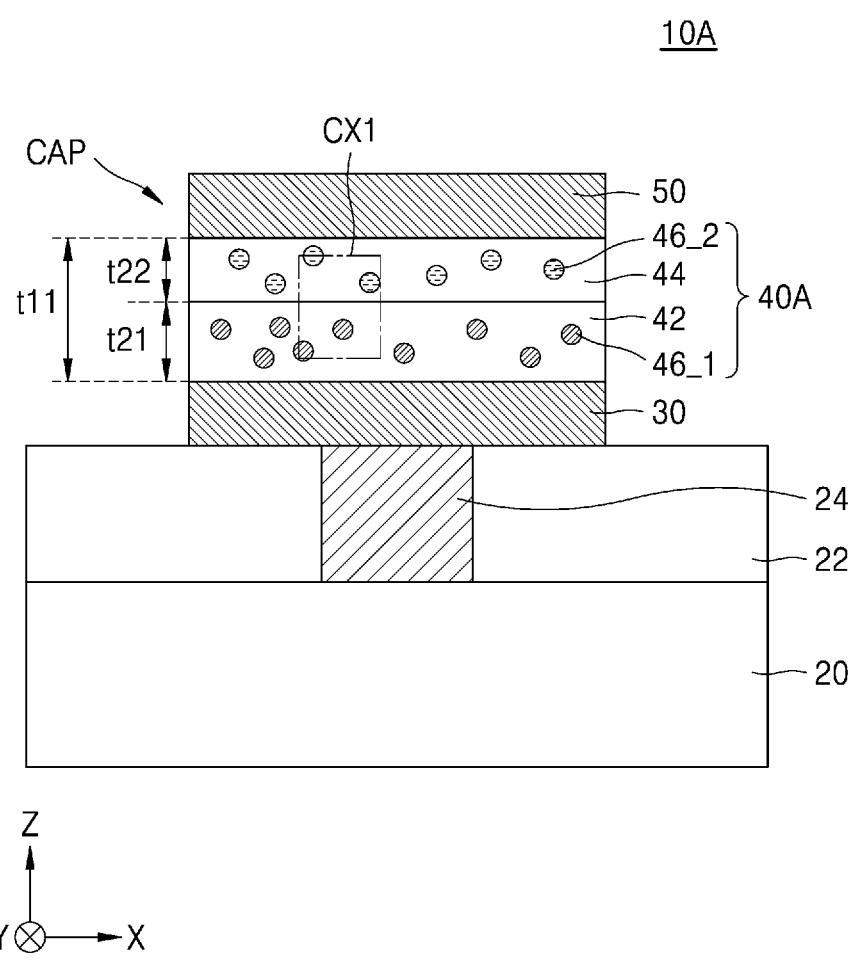
FIG. 6 is a cross-sectional view of a semiconductor device according to embodiments.
Figure 7:
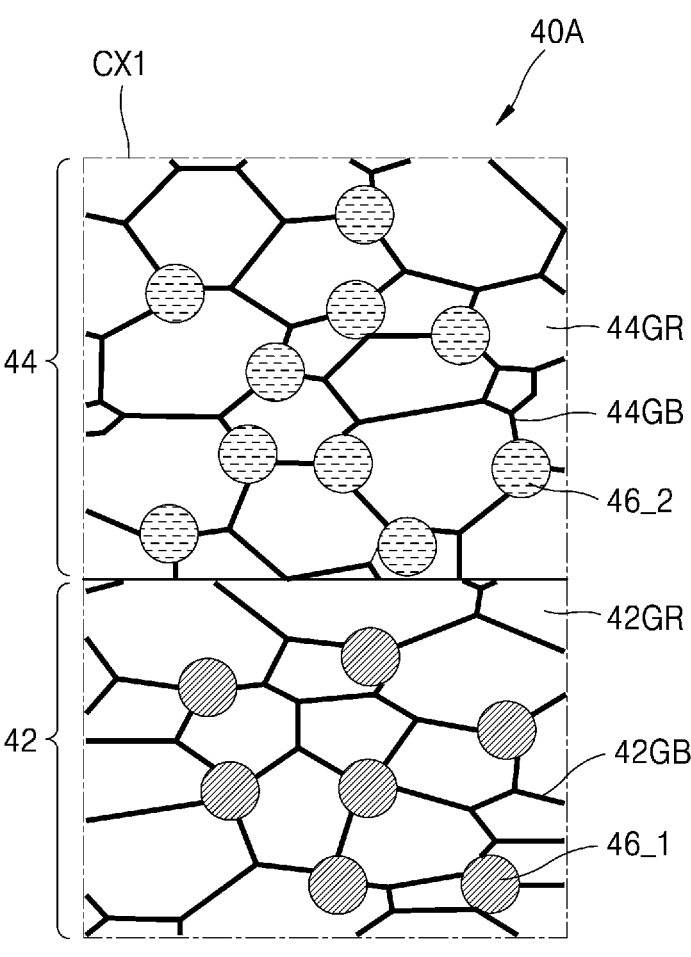
FIG. 7 is an enlarged view of a portion CX1 of FIG. 6.

FIG. 6 is a cross-sectional view of a semiconductor device 10A according to embodiments. FIG. 7 is an enlarged view of a portion CX1 of FIG. 6. In FIGS. 6 and 7, the same reference numerals as in FIGS. 1 to 5 may indicate the same components.

Referring to FIGS. 6 and 7, in an embodiment, a cell capacitor CAP includes a first electrode 30, a dielectric layer structure 40A, and a second electrode 50, and the dielectric layer structure 40A includes a first dielectric layer 42, a second dielectric layer 44, first dielectric particles 46_1, and second dielectric particles 46_2.

The first dielectric layer 42 includes a ferroelectric material. The first dielectric particles 46_1 are dispersed and arranged in the first dielectric layer 42. The first dielectric particles 46_1 include a paraelectric material and a material with a thermal expansion coefficient greater than $5.0 \times 10^{-6}$/K. A content of the first dielectric particles 46_1 in the first dielectric layer 42 is about 1% to about 10% of the total weight of the first dielectric layer 42.

The second dielectric layer 44 includes an antiferroelectric material. The second dielectric particles 46_2 are dispersed and arranged in the second dielectric layer 44. The second dielectric particles 46_2 include a paraelectric material and a material with a thermal expansion coefficient greater than $5.0 \times 10^{-6}$/K. A content of the second dielectric particles 46_2 in the second dielectric layer 44 is about 1% to about 10% of the total weight of the second dielectric layer 44.

In some embodiments, the second dielectric particles 46_2 include a material that differs from the material constituting the first dielectric particles 46_1. In some embodiments, the first dielectric particles 46_1 include aluminum oxide, and the second dielectric particles 46_2 include yttrium oxide. In some embodiments, the second dielectric particles 46_2 include the same material as the first dielectric particles 46_1, and the content of the second dielectric particles 46_2 in the second dielectric layer 44 differs from the content of the first dielectric particles 46_1 in the first dielectric layer 42.

In embodiments, the dielectric layer structure 40A exhibits superparaelectric characteristics, thereby allowing the cell capacitor CAP to have a relatively high capacitance.

Figure 8:
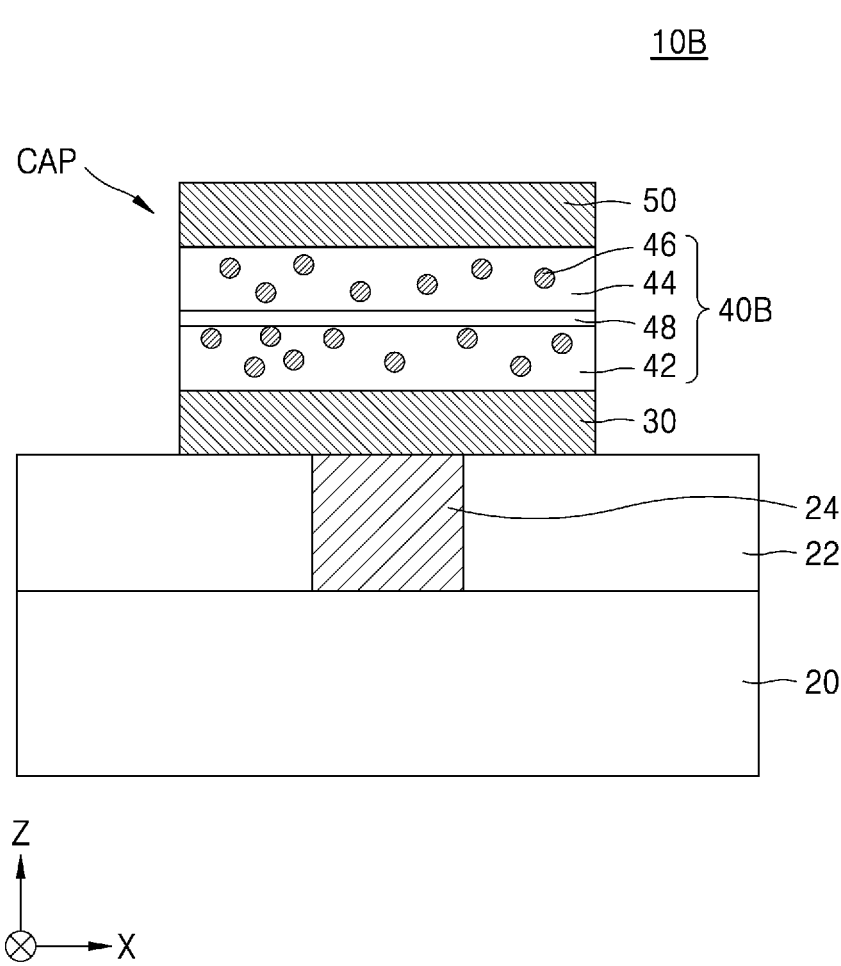
FIG. 8 is a cross-sectional view of a semiconductor device according to embodiments.

FIG. 8 is a cross-sectional view of a semiconductor device 10B according to embodiments. In FIG. 8, the same reference numerals as in FIGS. 1 to 7 may indicate the same components.

Referring to FIG. 8, in an embodiment, a dielectric layer structure 40B includes a first dielectric layer 42, a second dielectric layer 44, dielectric particles 46, and an interfacial layer 48. The interfacial layer 48 is provided between the first dielectric layer 42 and the second dielectric layer 44. In embodiments, the interfacial layer 48 includes at least one of $Y_2O_3$, $Al_2O_3$, $ZrO_2$, $SiO_2$, $TiO_2$, or $Cr_2O_3$. In some embodiments, the interfacial layer 48 is further formed between the first electrode 30 and the first dielectric layer 42 or between the second electrode 50 and the second dielectric layer 44, as well as between the first dielectric layer 42 and the second dielectric layer 44.

Figure 9:
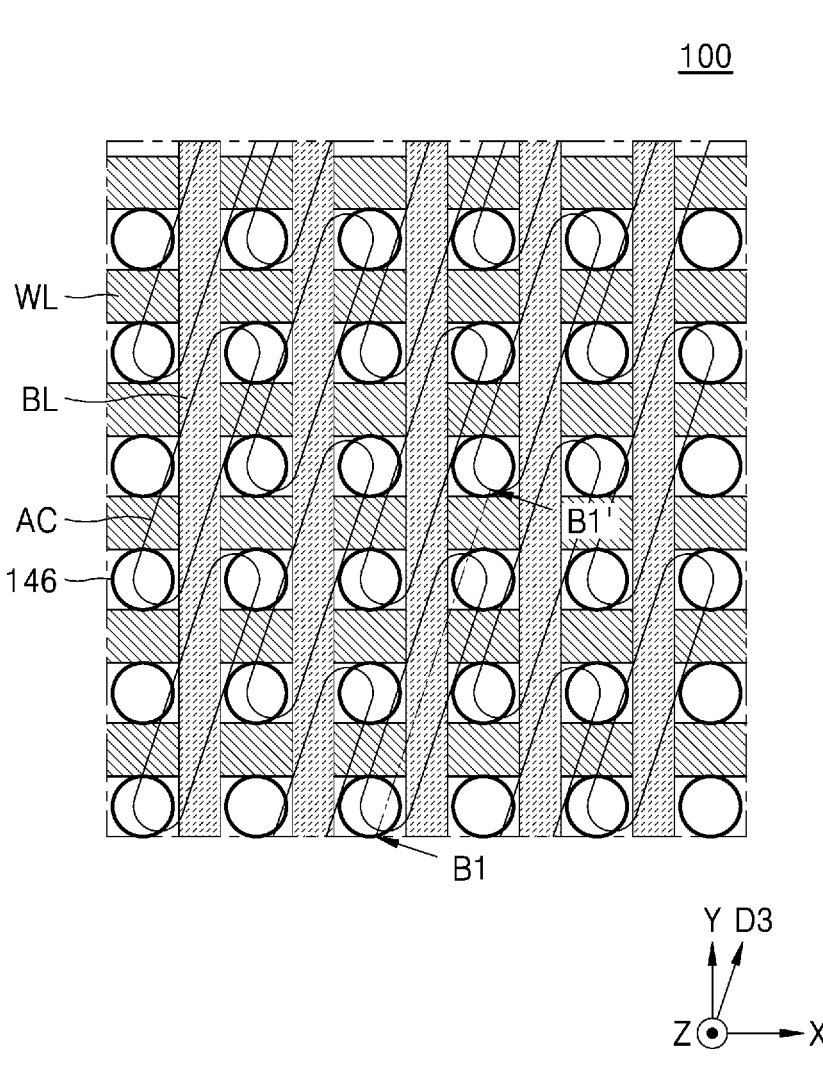
FIG. 9 is a layout diagram of a semiconductor device according to embodiments.
Figure 10:
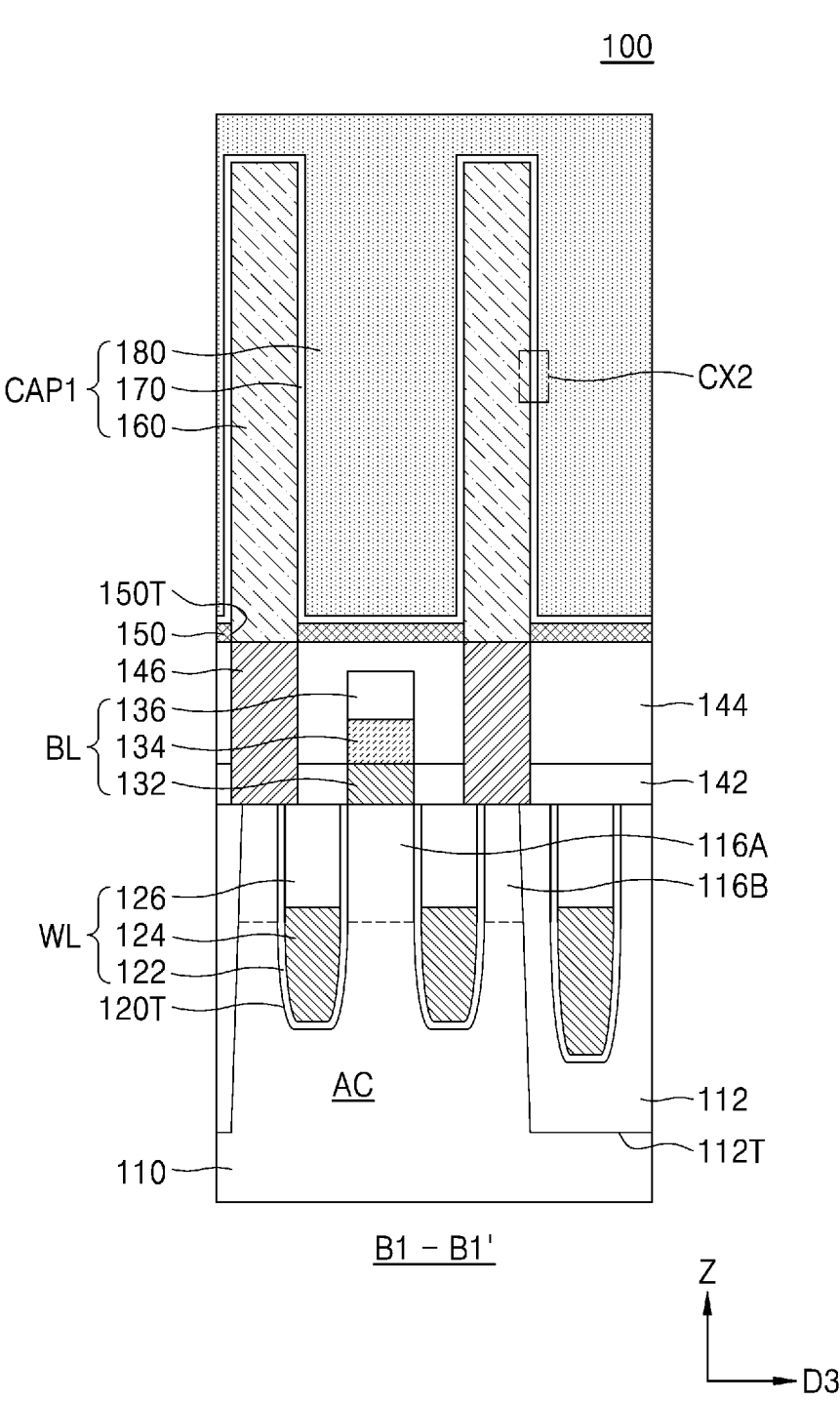
FIG. 10 is a cross-sectional view taken along line B1-B1' of FIG. 9.
Figure 11:
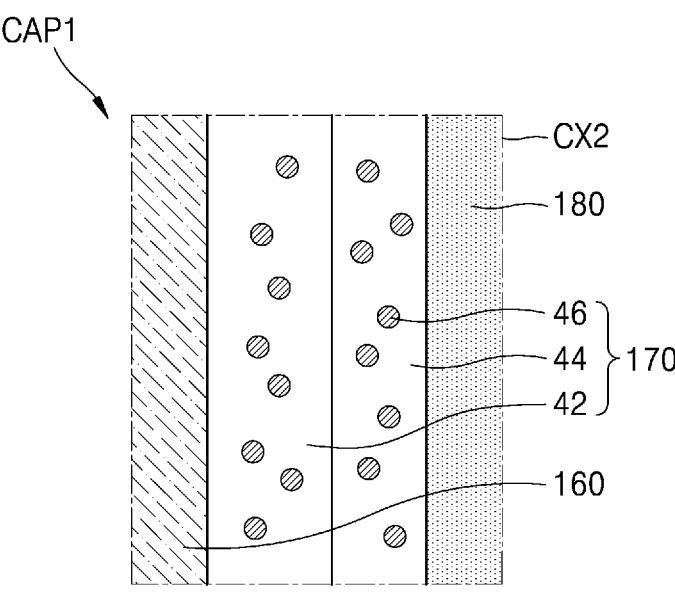
FIG. 11 is an enlarged view of a portion CX2 of FIG. 10.

FIG. 9 is a layout diagram of a semiconductor device 100 according to embodiments. FIG. 10 is a cross-sectional view taken along line B1-B1' of FIG. 9. FIG. 11 is an enlarged view of a portion CX2 of FIG. 10.

Referring to FIGS. 9 to 11, in an embodiment, a substrate 110 extends in an X direction and a Y direction that is perpendicular to the X direction. The substrate 110 includes an active region AC defined by a device isolation layer 112. In embodiments, the substrate 110 includes a semiconductor material, such as silicon (Si), germanium (Ge), silicon germanium (SiGe), silicon carbide (SiC), gallium arsenide (GaAs), indium arsenide (InAs), or indium phosphide (InP). In embodiments, the substrate 110 includes a conductive region, such as an impurity-doped well or an impurity-doped structure.

The device isolation layer 112 has a shallow trench isolation (STI) structure. For example, the device isolation layer 112 includes an insulating material within a device isolation trench 112T formed in the substrate 110. The insulating material includes, but is not necessarily limited to, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

Each of the active regions AC has a relatively long island shape that has a short axis and a long axis. As illustrated in FIG. 10, the long axis of the active region AC extends in a D3 direction parallel to the top surface of the substrate 110 and that crosses the X direction and the Y direction. In embodiments, the active region AC has a first conductivity type. The first conductivity type may be P type or N type.

The substrate 110 further includes a word line trench 120T that extends in the X direction parallel to the top surface of the substrate 110. The word line trench 120T crosses the active region AC and are formed to a predetermined depth from the top surface of the substrate 110. A portion of the word line trench 120T extends into the device isolation layer 112, and a portion of the word line trench 120T in the device isolation layer 112 has a bottom surface at a level that is lower than a bottom surface of a portion of the word line trench 120T formed in the active region AC.

A first source/drain region 116A and a second source/drain region 116B are formed at the upper portions of the active regions AC on both sides of the word line trench 120T. The first source/drain region 116A and the second source/drain region 116B are impurity regions doped with an impurity of a second conductivity type that is different from the first conductivity type. The second conductivity type may be N type or P type.

A word line WL is formed inside the word line trench 120T. The word line WL includes a gate insulating layer 122, a gate electrode 124, and a gate capping layer 126 that are sequentially formed on an inner wall of the word line trench 120T.

The gate insulating layer 122 is conformally formed on the inner wall of the word line trench 120T with a predetermined thickness. The gate insulating layer 122 is formed of at least one of silicon oxide, silicon nitride, silicon oxynitride, oxide/nitride/oxide (ONO), or a high-k dielectric material that has a dielectric constant higher than that of silicon oxide. For example, the gate insulating layer 122 has a dielectric constant of about 10 to 25. In some embodiments, the gate insulating layer 122 is formed of $HfO_2$, $Al_2O_3$, $HfAlO_3$, $Ta_2O_3$, $TiO_2$, or a combination thereof, but is not necessarily limited thereto.

The gate electrode 124 is formed on the gate insulating layer 122 and fills the word line trench 120T from the bottom of the word line trench 120T to a predetermined height thereof. The gate electrode 124 includes a work function control layer formed on the gate insulation layer 122 and a buried metal layer that fills a bottom part of the word line trench 120T on the work function control layer. For example, the work function control layer includes a metal, a metal nitride, or a metal carbide, such as Ti, TiN, TiAlN, TiAlC, TiAlCN, TiSiCN, Ta, TaN, TaAlN, TaAlCN, or TaSiCN, etc., and the buried metal layer includes at least one of W, WN, TiN, or TaN.

The gate capping layer 126 on the gate electrode 124 fills a remaining portion of the word line trench 120T. The gate capping layer 126 includes at least one of silicon oxide, silicon oxynitride, or silicon nitride.

A bit line BL that extends in the Y direction parallel to the top surface of the substrate 110 is formed on the first source/drain region 116A. The bit line BL includes a bit line contact 132, a bit line conductive layer 134, and a bit line capping layer 136 that are sequentially stacked on the substrate 110 in in a Z direction that is perpendicular to a plane defined by the X direction and the Y direction. The bit line contact 132 includes polysilicon, and the bit line conductive layer 134 includes a metal. The bit line capping layer 136 includes an insulating material, such as silicon nitride, silicon oxynitride, etc. Although FIG. 10 shows that the bottom surface of the bit line contact 132 is formed at the same level as the top surface of the substrate 110, embodiments are not necessarily limited thereto, and the bottom surface of the bit line contact 132 may be formed at a lower level than the top surface of the substrate 110.

In an embodiment, a bit line intermediate layer is provided between the bit line contact 132 and the bit line conductive layer 134. The bit line intermediate layer includes a metal silicide, such as tungsten silicide, or a metal nitride, such as tungsten nitride. A bit line spacer is further formed on the sidewall of the bit line BL. The bit line spacer may have a single-layer structure or a multi-layer structure formed of an insulating material, such as silicon oxide, silicon oxynitride, or silicon nitride. In addition, the bit line spacer may further include an air space.

A first interlayer insulating layer 142 is formed on the substrate 110, and the bit line contact 132 penetrates the first interlayer insulating layer 142 and is connected to the first source/drain region 116A. The bit line conductive layer 134 and the bit line capping layer 136 are disposed on the first interlayer insulating layer 142. A second interlayer insulating layer 144 is disposed on the first interlayer insulating layer 142 and covers the side surfaces and the top surfaces of the bit line conductive layer 134 and the bit line capping layer 136.

A capacitor contact 146 is disposed on the second source/drain region 116B. The sidewall of the capacitor contact 146 are covered by the first and second interlayer insulating layers 142 and 144. In embodiments, the capacitor contact 146 includes a lower contact pattern, a metal silicide layer, an upper contact pattern, and a barrier layer that surrounds the side surface and the bottom surface of the upper contact pattern that are sequentially stacked on the substrate 110 in the Z direction. In embodiments, the lower contact pattern includes polysilicon, and the upper contact pattern includes a metal. The barrier layer includes a conductive metal nitride.

A cell capacitor CAP1 is formed on the second interlayer insulating layer 144. The cell capacitor CAP1 includes a lower electrode 160, a dielectric layer structure 170, and an upper electrode 180. The lower electrode 160 is electrically connected to the capacitor contact 146, the dielectric layer structure 170 covers the lower electrode 160, and the upper electrode 180 covers the lower electrode 160 on the dielectric layer structure 170. In embodiments, an etching stop layer 150 that includes an opening 150T is formed on the second interlayer insulating layer 144, and a bottom part of the lower electrode 160 is disposed in the opening 150T of the etching stop layer 150.

FIGS. 9 and 10 show that the cell capacitors CAP1 are repeatedly arranged in the X direction and the Y direction on the capacitor contacts 146 that are also repeatedly arranged in the X direction and the Y direction. However, embodiments are not necessarily limited thereto, and in an embodiment, the cell capacitors CAP1 are arranged in a hexagonal pattern, such as a honeycomb structure, on the capacitor contacts 146. For example, a landing pad is further formed between each of the capacitor contacts 146 and each of the cell capacitors CAP1.

The lower electrode 160 has a pillar shape that extends in the vertical direction Z on the capacitor contact 146, and the dielectric layer structure 170 is conformally formed on the top surface and the sidewall of the lower electrode 160. The dielectric layer structure 170 includes a first dielectric layer 42 formed on the top surface of the lower electrode 160, a second dielectric layer 44 formed on the first dielectric layer 42, and dielectric particles 46 dispersed and arranged in the first and second dielectric layers 42 and 44. FIG. 11 shows that the first dielectric layer 42 faces and contacts the lower electrode 160 and the second dielectric layer 44 faces and contacts the upper electrode 180. However, embodiments are not necessarily limited thereto, and in an embodiment, the first dielectric layer 42 faces and contacts the upper electrode 180 and the second dielectric layer 44 faces and contacts the lower electrode 160.

Detailed description of the lower electrode 160, the dielectric layer structure 170, and the upper electrode 180 are substantially the same as the description of the first electrode 30, the dielectric layer structure 40, and the second electrode 50 described with reference to FIGS. 1 to 8.

According to the semiconductor device 100 according to embodiments, the dielectric layer structure 170 exhibits superparaelectric characteristics, and thus has a relatively high capacitance. Accordingly, the semiconductor device 100 has an increased capacitance.

Figure 12:
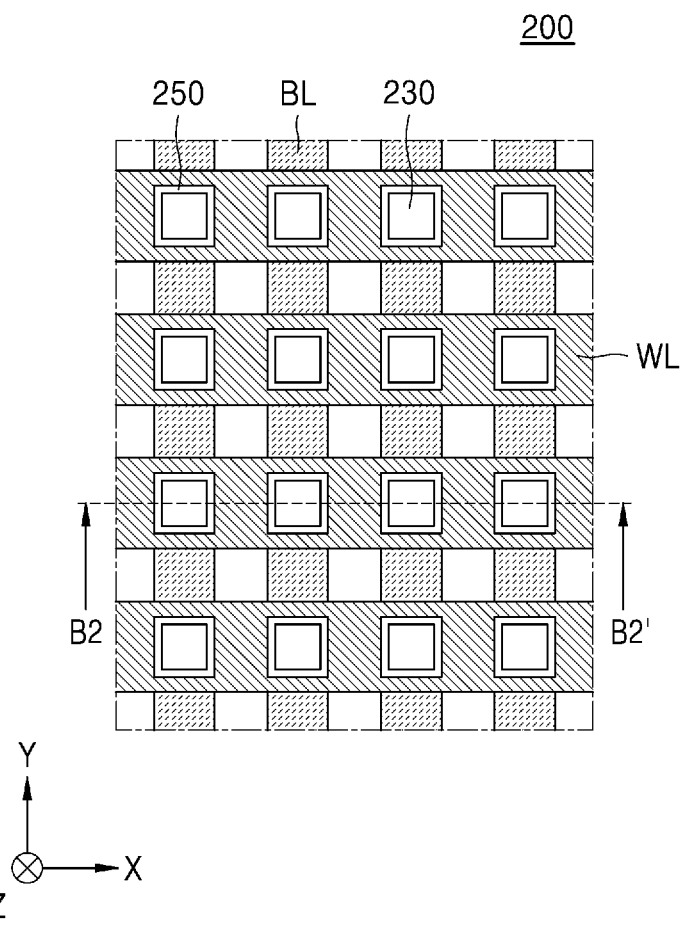
FIG. 12 is a layout diagram of a semiconductor device according to embodiments.
Figure 13:
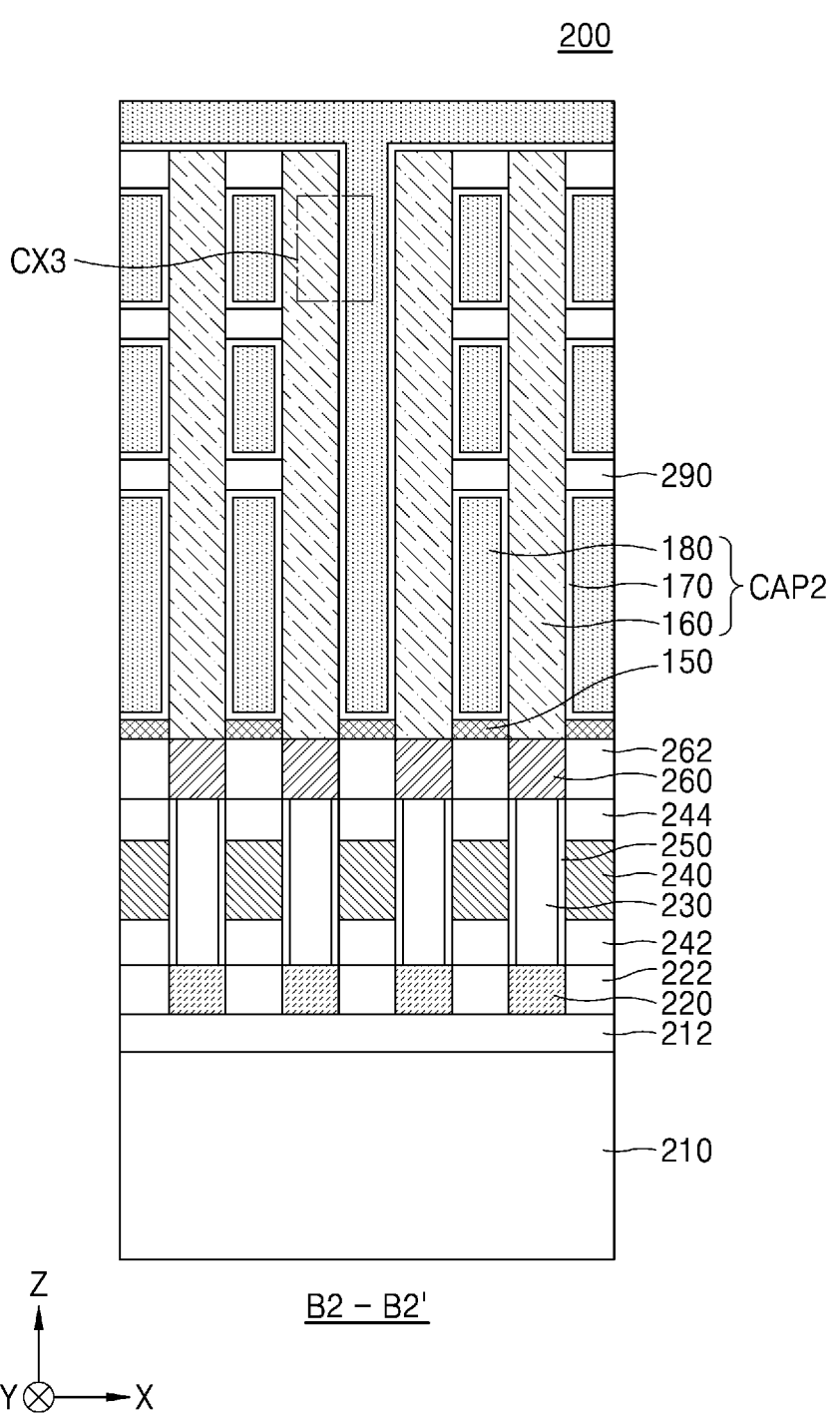
FIG. 13 is a cross-sectional view taken along line B2-B2' of FIG. 12.
Figure 14:
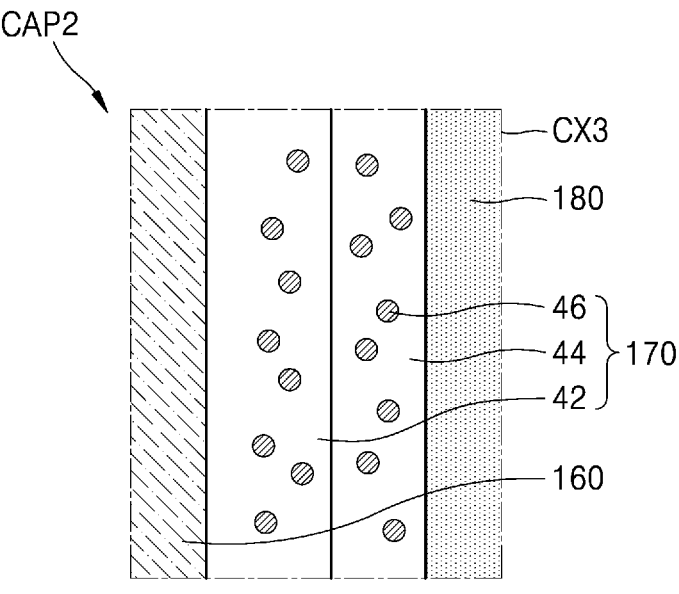
FIG. 14 is an enlarged view of a portion CX3 of FIG. 13.
Figure 14:
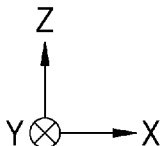

FIG. 12 is a layout diagram of a semiconductor device 200 according to embodiments. FIG. 13 is a cross-sectional view taken along line B2-B2' of FIG. 12. FIG. 14 is an enlarged view of a portion CX3 of FIG. 13.

Referring to FIGS. 12 to 14, the semiconductor device 200 includes a plurality of first conductive lines 220, a channel layer 230, a gate electrode 240, a gate insulating layer 250, and a cell capacitor CAP2 that are disposed on a substrate 210. The semiconductor device 200 may be a memory device that includes a vertical channel transistor (VCT), and the VCT has a structure in which the channel layer 230 extends from the substrate 210 in a vertical Z direction.

A lower insulating layer 212 is disposed on the substrate 210, and the plurality of first conductive lines 220 are spaced apart from each other in the first horizontal direction X and extend in the second horizontal direction Y on the lower insulating layer 212. A plurality of first insulating patterns 222 are disposed on the lower insulating layer 212 that respectively fill spaces between the plurality of first conductive lines 220. The plurality of first conductive lines 220 correspond to the bit lines BL of the semiconductor device 200.

In embodiments, the plurality of first conductive lines 220 include at least one of doped polysilicon, a metal, a conductive metal nitride, a conductive metal silicide, a conductive metal oxide, or a combination thereof. For example, the plurality of first conductive lines 220 include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not necessarily limited thereto. The plurality of first conductive lines 220 may include a single layer or multiple layers of the above-described materials. In embodiments, the plurality of first conductive lines 220 include a two-dimensional (2D) semiconductor material, and for example, the 2D semiconductor material includes at least one of graphene, carbon nanotubes, or a combination thereof.

The channel layer 230 is arranged in island shapes spaced apart from each other in the first horizontal direction X and the second horizontal direction Y on the plurality of first conductive lines 220. The channel layer 230 has a first width in the first horizontal direction X and a first height in the vertical direction Z, and the first height is greater than the first width. For example, the first height may be about 2 to 10 times the first width, but is not necessarily limited thereto. The bottom portion of the channel layer 230 functions as a first source/drain region, and the upper portion of the channel layer 230 functions as a second source/drain region, and part of the channel layer 230 between first and second source/drain regions functions as a channel region.

In embodiments, the channel layer 230 includes an oxide semiconductor, and for example, the oxide semiconductor includes at least one of $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_x$-$Ga_yZn_zO$, $In_xGa_zO$, or a combination thereof. The channel layer 230 may include a single layer or multiple layers of the oxide semiconductors. In some embodiments, the channel layer 230 has a bandgap energy greater than the bandgap energy of silicon. For example, the channel layer 230 has a bandgap energy of about 1.5 eV to about 5.6 eV. For example, the channel layer 230 has an optimized channel performance when the bandgap energy is about 2.0 eV to about 4.0 eV. For example, the channel layer 230 may be polycrystalline or amorphous, but is not necessarily limited thereto. In embodiments, the channel layer 230 includes a two-dimensional (2D) semiconductor material, and for example, the 2D semiconductor material is one of graphene, carbon nanotubes, or a combination thereof.

The gate electrode 240 surrounds the sidewall of the channel layer 230 and extend in the first direction (X direction). In a plan view, the gate electrode 240 is a gate all-around type gate electrode that surrounds the entire sidewall, for example, all four sidewalls, of the channel layer 230. The gate electrode 240 corresponds to the word line WL of the semiconductor device 200.

In some embodiments, the gate electrode 240 is a dual gate-type gate electrode, and includes, for example, a first sub-gate electrode that faces a first sidewall of the channel layer 230 and a second sub-gate electrode that faces a second sidewall opposite to the first sidewall of the channel layer 230. In some embodiments, the gate electrode 240 is a single gate-type gate electrode that covers the first sidewall of the channel layer 230 and extends in the first horizontal direction X.

The gate electrode 240 includes at least one of doped polysilicon, a metal, a conductive metal nitride, a conductive metal silicide, a conductive metal oxide, or a combination thereof. For example, the gate electrode 240 includes at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not necessarily limited thereto.

The gate insulating layer 250 surrounds the sidewall of the channel layer 230 and is provided between the channel layer 230 and the gate electrode 240. In embodiments, the gate insulating layer 250 includes at least one of a silicon oxide layer, a silicon oxynitride layer, a high-k dielectric layer that has a dielectric constant higher than that of the silicon oxide layer, or a combination thereof. The high-k dielectric layer is made of a metal oxide or a metal oxynitride. For example, the high-k dielectric layer as the gate insulating layer 250 is formed of at least one of HfO$_2$, HfSiO, HfSiON, HfTaO, HfTiO, HfZrO, ZrO$_2$, Al$_2$O$_3$, or a combination thereof, but is not necessarily limited thereto.

A first buried insulating layer 242 that surrounds the lower sidewall of the channel layer 230 is disposed on the plurality of first insulating patterns 222, and a second buried insulating layer 244 that surrounds the upper sidewall of the channel layer 230 and covers the gate electrode 240 is disposed on the first buried insulating layer 242.

A capacitor contact 260 is disposed on the channel layer 230. The capacitor contacts 260 vertically overlap the channel layer 230 and are arranged in a matrix pattern and are spaced apart in the first direction (X direction) and the second direction (Y direction). The capacitor contact 260 includes at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but is not necessarily limited thereto. An upper insulating layer 262 is disposed on the second buried insulating layer 244 and surrounds a sidewall of the capacitor contact 260.

An etching stop layer 150 is disposed on the upper insulating layer 262, and a cell capacitor CAP2 is disposed on the etching stop layer 150. The cell capacitor CAP2 includes a lower electrode 160, a dielectric layer structure 170, and an upper electrode 180. The lower electrode 160 is electrically connected to the capacitor contact 260, the dielectric layer structure 170 covers the lower electrode 160, and the upper electrode 180 covers the lower electrode 160 on the dielectric layer structure 170. A support member 290 is disposed on a sidewall of the lower electrode 160.

While embodiments of the inventive concept have been particularly shown and described with reference to the drawings, it will be understood that various changes in form and details may be made therein without departing from the spirit and scope of the following claims.

What is claimed is:

1. A semiconductor device, comprising:
a cell capacitor disposed on a substrate and that includes a first electrode, a dielectric layer structure, and a second electrode,
wherein the dielectric layer structure comprises:
a first dielectric layer disposed on the first electrode and that includes a ferroelectric material;
a second dielectric layer disposed on the first dielectric layer and that includes an antiferroelectric material; and
dielectric particles dispersed in at least one of the first dielectric layer or the second dielectric layer and that include a paraelectric material.

2. The semiconductor device of claim 1, wherein
the first dielectric layer comprises at least one of HfO$_2$, Hf$_{1-x}$Zr$_x$O$_2$ (0<x≤0.5), Ba$_{1-x}$Sr$_x$TiO$_3$ (0≤x≤0.3), BaTiO$_3$, or PbZr$_x$Ti$_{1-x}$O$_3$ (0≤x≤0.1),
the second dielectric layer comprises at least one of Hf$_{1-x}$Zr$_x$O$_2$ (0.5<x<1.0), ZrO$_2$, PbZrO$_3$, or PbHfO$_3$, and
the dielectric particles comprise at least one of Y$_2$O$_3$, Al$_2$O$_3$, ZrO$_2$, SiO$_2$, TiO$_2$, or Cr$_2$O$_3$.

3. The semiconductor device of claim 1, wherein the dielectric layer structure has a first thickness in a thickness direction of the dielectric layer structure, and the first thickness is about 30 Å to 60 Å.

4. The semiconductor device of claim 1, wherein the dielectric particles comprise a material that has a thermal expansion coefficient greater than 5.0×10$^{-6}$/K.

5. The semiconductor device of claim 1, wherein a content of the dielectric particles in the dielectric layer structure is about 1 weight % (wt %) to 10 wt % with respect to the dielectric layer structure.

6. The semiconductor device of claim 1, wherein
the first dielectric layer comprises first grains, and
the dielectric particles are dispersed and arranged at a grain boundary between the first grains of the first dielectric layer, and wherein
the second dielectric layer comprises second grains, and
the dielectric particles are dispersed and arranged at a grain boundary between the second grains of the second dielectric layer.

7. The semiconductor device of claim 1, wherein the dielectric particles have an average diameter of about 1 Å to 5 Å.

8. The semiconductor device of claim 1, wherein the dielectric particles comprise:
first dielectric particles dispersed in the first dielectric layer and that include a first paraelectric material; and
second dielectric particles dispersed in the second dielectric layer and that include a second paraelectric material, wherein the second paraelectric material differs from the first paraelectric material.

9. The semiconductor device of claim 8, wherein
a content of the first dielectric particles in the first dielectric layer is about 1 wt % to 10 wt % with respect to the first dielectric layer, and
a content of the second dielectric particles in the second dielectric layer is about 1 wt % to 10 wt % with respect to the second dielectric layer.

10. The semiconductor device of claim 1, further comprising an interfacial layer provided between the first dielectric layer and the second dielectric layer, wherein the interfacial layer comprises at least one of $Y_2O_3$, $Al_2O_3$, $ZrO_2$, $SiO_2$, $TiO_2$, or $Cr_2O_3$.

11. The semiconductor device of claim 1, wherein the dielectric layer structure exhibits superparaelectric properties.

12. A semiconductor device, comprising:

a cell capacitor disposed on a substrate and that includes a first electrode, a dielectric layer structure, and a second electrode, wherein the dielectric layer structure comprises:

a first dielectric layer that has a first thickness in a thickness direction of the dielectric layer structure and includes a ferroelectric material;

a second dielectric layer disposed on the first dielectric layer, wherein the second dielectric layer has a second thickness in the thickness direction of the dielectric layer structure, and comprises an antiferroelectric material; and dielectric particles dispersed in the first dielectric layer and the second dielectric layer and that include a paraelectric material, wherein the dielectric particles comprise a material that has a coefficient of thermal expansion that is greater than $5.0 \times 10^{-6}$/K, and the dielectric particles are impart stress to first grains of the first dielectric layer and second grains of the second dielectric layer.

13. The semiconductor device claim 12, wherein a content of the dielectric particles in the dielectric layer structure is about 1 wt % to 10 wt % with respect to the dielectric layer structure.

14. The semiconductor device of claim 12, wherein the dielectric particles have an average diameter of 1 Å to 5 Å, and the dielectric particles are dispersed and arranged at a grain boundary between the first grains of the first dielectric layer and a grain boundary between the second grains of the second dielectric layer.

15. The semiconductor device of claim 12, wherein the dielectric layer structure has a third thickness in the thickness direction of the dielectric layer structure, and the third thickness is about 30 Å to 60 Å.

16. The semiconductor device of claim 12, wherein the first dielectric layer comprises at least one of $HfO_2$, $Hf_{1-x}Zr_xO_2$ ($0<x\leq0.5$), $Ba_{1-x}Sr_xTiO_3$ ($0\leq x\leq0.3$), $BaTiO_3$, or $PbZr_xTi_{1-x}O_3$ ($0\leq x\leq0.1$), the second dielectric layer comprises at least one of $Hf_{1-x}Zr_xO_2$ ($0.5<x<1.0$), $ZrO_2$, $PbZrO_3$, or $PbHfO_3$, and wherein the dielectric particles comprise at least one of $Y_2O_3$, $Al_2O_3$, $ZrO_2$, $SiO_2$, $TiO_2$, or $Cr_2O_3$.

17. A semiconductor device, comprising:

a word line disposed in a word line trench that extends in a first direction on a substrate;

a capacitor contact disposed on the substrate at one side of the word line; and a cell capacitor disposed on the capacitor contact and electrically connected to the capacitor contact, wherein the cell capacitor comprises:

a first electrode disposed on the capacitor contact;

a dielectric layer structure disposed on the first electrode; and a second electrode disposed on the dielectric layer structure, wherein the dielectric layer structure comprises:

a first dielectric layer disposed on the first electrode and that includes a ferroelectric material;

a second dielectric layer disposed on the first dielectric layer and that includes an antiferroelectric material; and dielectric particles dispersed in at least one of the first dielectric layer or the second dielectric layer, and that include a paraelectric material, wherein the dielectric particles comprise at least one of $Y_2O_3$, $Al_2O_3$, $ZrO_2$, $SiO_2$, $TiO_2$, or $Cr_2O_3$.

18. The semiconductor device of claim 17, wherein the dielectric layer structure exhibits superparaelectric properties.

19. The semiconductor device of claim 17, wherein the dielectric particles comprise a material that has a thermal expansion coefficient greater than $5.0 \times 10^{-6}$/K, and the dielectric particles apply stress to first grains of the first dielectric layer and second grains of the second dielectric layer.

20. The semiconductor device of claim 17, wherein the dielectric particles have an average diameter of 1 Å to 5 Å, and a content of the dielectric particles in the dielectric layer structure is about 1 wt % to 10 wt % with respect to the dielectric layer structure.

* * * * *